(12) United States Patent
Kitagawa (10) Patent No.: US 6,255,968 B1
(45) Date of Patent: Jul. 3, 2001

(54) DATA COMPRESSION METHOD AND APPARATUS

(75) Inventor: Shuji Kitagawa, Ibaraki (JP)

(73) Assignee: NuCORE Technology Inc., Santa Clara, CA (US)

( * ) Notice: Subject to any disclaimer, the term of this patent is extended or adjusted under 35 U.S.C. 154(b) by 0 days.

(21) Appl. No.: 09/433,780

(22) Filed: Nov. 3, 1999

(30) Foreign Application Priority Data

Nov. 18, 1998 (JP) .................................................. 10-328102

(51) Int. Cl.$^7$ ...................................................... H03M 7/00
(52) U.S. Cl. ................................................................ 341/87
(58) Field of Search ................................ 341/87, 51, 50, 341/65, 67, 106, 107

(56) References Cited

U.S. PATENT DOCUMENTS

| | | | |
|---|---|---|---|
| 5,502,441 | 3/1996 | Swenson | 341/172 |
| 5,506,801 | 4/1996 | Tawel | 364/807 |
| 5,581,485 | 12/1996 | Van Aken | 364/561 |
| 5,933,104 | * 8/1999 | Kimura | 341/87 |
| 6,127,953 | * 10/2000 | Manzardo | 341/87 |

\* cited by examiner

*Primary Examiner*—Brian Young
(74) *Attorney, Agent, or Firm*—Townsend and Townsend and Crew LLP; Kenneth R. Allen (57) ABSTRACT

In a data compression method of sequentially sampling an analog input signal at discrete sample points, and classifying a plurality of obtained sample values into a plurality of sections, a sampling string made up of sample values included in each section is set as the first sampling string. A function which takes a sample value at a predetermined sample point included in the first sampling string and is approximated to the first sampling string is generated. A parameter defining the function is output as an element of compressed data. A second sampling string made up of sample values obtained at respective sample points by the function is generated. Predetermined calculation is performed between two sample values at identical sample points in the first and second sampling strings for each section to calculate a new sample value, thereby creating a third sampling string in which a new sample value at an arbitrary sample point is 0. The third sampling string is compared with a plurality of reference patterns set as reference sampling strings in advance.

13 Claims, 9 Drawing Sheets

DATA COMPRESSION METHOD AND APPARATUS

BACKGROUND OF THE INVENTION

The present invention relates to a data compression method and apparatus and, more particularly, to a data compression method and apparatus for compressing and outputting an analog input signal.

Conventionally, when one- or two-dimensional analog data such as audio data, mechanical vibration waveform, and image are to be compressed, the data are temporarily sampled on the time axis, quantized into digital data by an A/D converter, and compressed by digital arithmetic processing.

Digital data (original data) are compressed and reconstructed by a loss-less compression method of completely reconstructing the original data or a lossy compression method by which part of the original data is lost. The present invention approximates sampled data by another waveform, so that the lossy compression method will be explained.

Figure 12A:
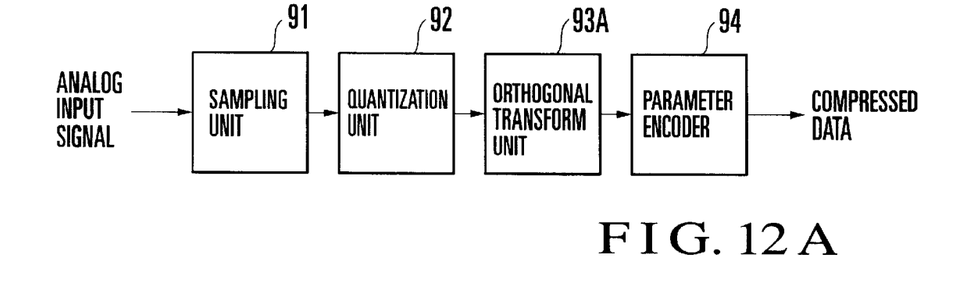
FIGS. 12A and 12B are block diagrams, respectively, showing a conventional data compression apparatus.
Figure 12B:
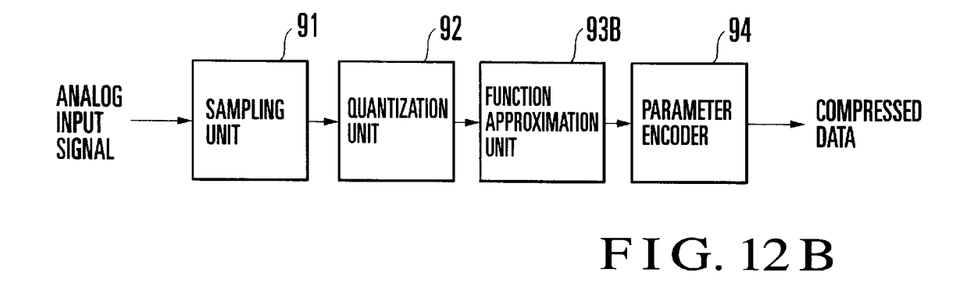

As shown in FIGS. 12A and 12B, conventional compression processes are roughly classified into a method using orthogonal transform and a method using function approximation.

According to the method using orthogonal transform, as shown in FIG. 12A, an analog input signal is sampled and quantized by a sampling unit 91 and quantization unit 92, respectively. The original data (digital data) output from the quantization unit 92 is divided into small sections by an orthogonal transform unit 93A.

Each section is decomposed into frequency space elements by orthogonal transform such as Fourier transform, DCT (Discrete Cosine Transform), or Walsh transform. This decreases the correlation degree between respective sample point on the original data.

The magnitude of each frequency element after orthogonal transform is encoded by a parameter encoder 94 using a code table, thereby obtaining compressed data.

According to the method using function approximation, as shown in FIG. 12B, the orthogonal transform unit 93A is replaced by a function approximation unit 93B. The feature of each section of original data (digital data) output from the quantization unit 92 is approximated by any function.

The approximated bit data (digital data) is encoded by the parameter encoder 94 using a variable-length coding table of Huffman coding or the like.

As orthogonal transform, there is proposed a method using orthogonal transform such as Slant, Haar, or Wavelet, in addition to the above transform methods. An appropriate orthogonal transform method is used in consideration of various factors such as the property and simple calculation of original data, simple circuit arrangement, and simple high-speed processing.

Further, the following method is also used. Quantized digital data is segmented into small data sections in the original data space (real space), each section is approximated using a simple algebraic curve (e.g., a straight line which approximates each data section), and the algebraic function coefficient is compressed and stored.

To the contrary, methods of reconstructing the original data waveform from compressed data can be roughly classified into a method using orthogonal transform and a method using function approximation.

Figure 13A:
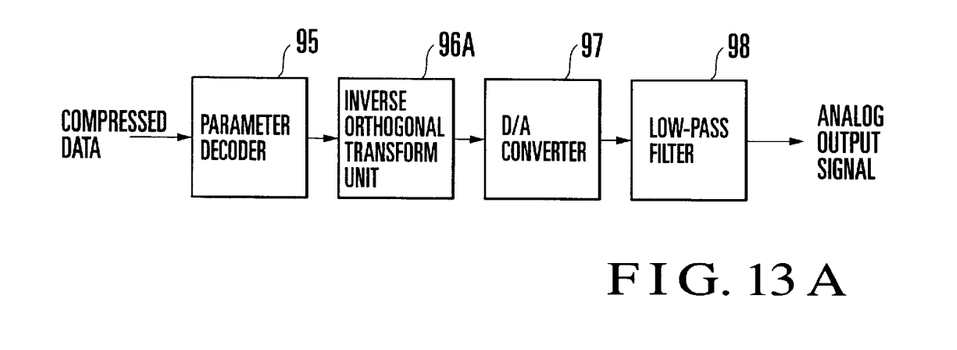
FIGS. 13A and 13B are block diagrams, respectively, showing a conventional data reconstruction apparatus.

According to the compression method shown in FIG. 13A using orthogonal transform, a parameter decoder 95 calculates orthogonal transform coefficients from compressed data using a code table.

An inverse orthogonal transform unit 96A performs inverse orthogonal transform using these coefficients to calculate approximate data of original data for each section. A D/A converter 97 converts the data into an analog signal to obtain an analog output signal approximated to the original data through a low-pass filter 98.

Figure 13B:
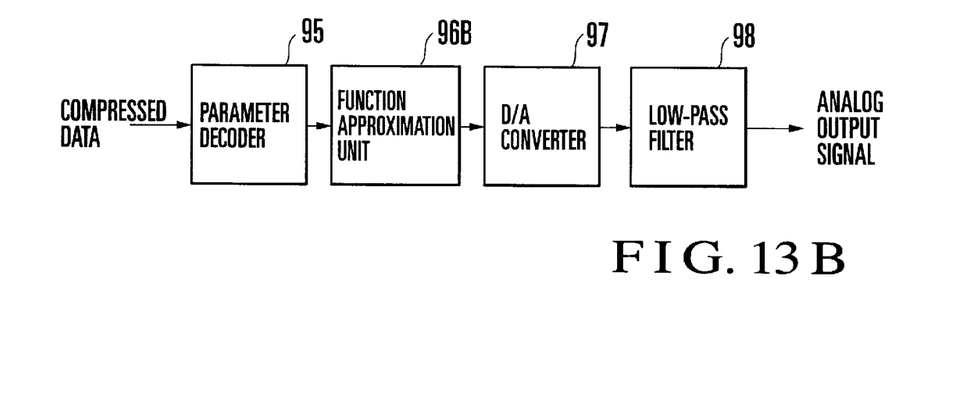

According to the method using function approximation, as shown in FIG. 13B, the inverse orthogonal transform unit is replaced by a function approximation unit 96B. The function approximation unit 96B performs function approximation using coefficients obtained by the parameter decoder 95, thereby calculating approximate data of original data for each section.

In general, the orthogonal transform unit 93A and inverse orthogonal transform unit 96A are identical circuits as hardware, and are different only in calculation contents.

Also, the function approximation units 93B and 96B are identical circuits as hardware.

However, in each conventional data compression method, the value (sample value) of each sample point after sampling is quantized (digital) data, and the data is compressed by operating the digital value. Compression using this quantized digital data causes a rounding error at the least significant bit by a plurality of times of processing in compression. The compression algorithm decreases the bit precision of the sample value.

A higher compression ratio rapidly decreases the approximate degree of the waveform after compression/reconstruction with respect to the original waveform (sampling string). The quality of reconstructed data greatly degrades with an increase in compression ratio.

In addition, the conventional digital data compression must execute a large number of digital numerical calculations in function approximation, orthogonal transform, and encoding.

For example, letting k be the number of points in the section, 2k product-sum calculations or klog 2k product-sum calculations even using a high-speed calculation method must be done for orthogonal transform.

Similarly, product-sum calculation must be done for reconstruction. When the above high-speed calculation method is used, the number k of calculation points must satisfy 2J=k (J is a positive integer).

Even in processing of compressing data by substituting it into the algebraic curve in the real space, many calculations must be done to search for a coefficient almost free from any error in approximation calculation using the algebraic curve.

For this reason, when audio data and image data are to be compressed, a high-speed A/D converter, high-speed MPU, digital signal processor (DSP), and the like are required to shorten the data compression time in application fields necessary for very-high-speed processing, e.g., real-time compression.

Hence, an integrated circuit (IC) dedicated for each processing must be developed and manufactured, and a high-speed MPU must be used for processing. This increases the product development cost, product cost, and power consumption.

SUMMARY OF THE INVENTION

The present invention has been made to overcome the conventional drawbacks, and has as its object to provide a data compression method and apparatus capable of compressing an analog signal at high precision with a simple circuit arrangement without performing many calculations.

To achieve the above object, according to the present invention, there is provided a data compression method of sequentially sampling an analog input signal at discrete sample points, classifying a plurality of obtained sample values into a plurality of sections, and compressing the analog input signal, comprising the steps of setting a sampling string made up of sample values included in each section as a first sampling string of the section, generating a function which takes a sample value at a predetermined sample point included in the first sampling string and is approximated to the first sampling string, outputting a parameter defining the function as an element of compressed data of the section, and generating a second sampling string made up of sample values obtained at respective sample points by the function, performing predetermined calculation between two sample values at identical sample points in the first and second sampling strings for each section to calculate a new sample value, thereby creating for each section a third sampling string in which a new sample value at an arbitrary sample point is 0, and comparing for each section the third sampling string with a plurality of reference patterns set as reference sampling strings in advance, selecting a reference pattern most approximate to the third sampling string, and outputting a pattern code representing the selected reference pattern as an element of compressed data of the section.

DESCRIPTION OF THE PREFERRED EMBODIMENTS

The present invention will be described with reference to the accompanying drawings.

Figure 1:
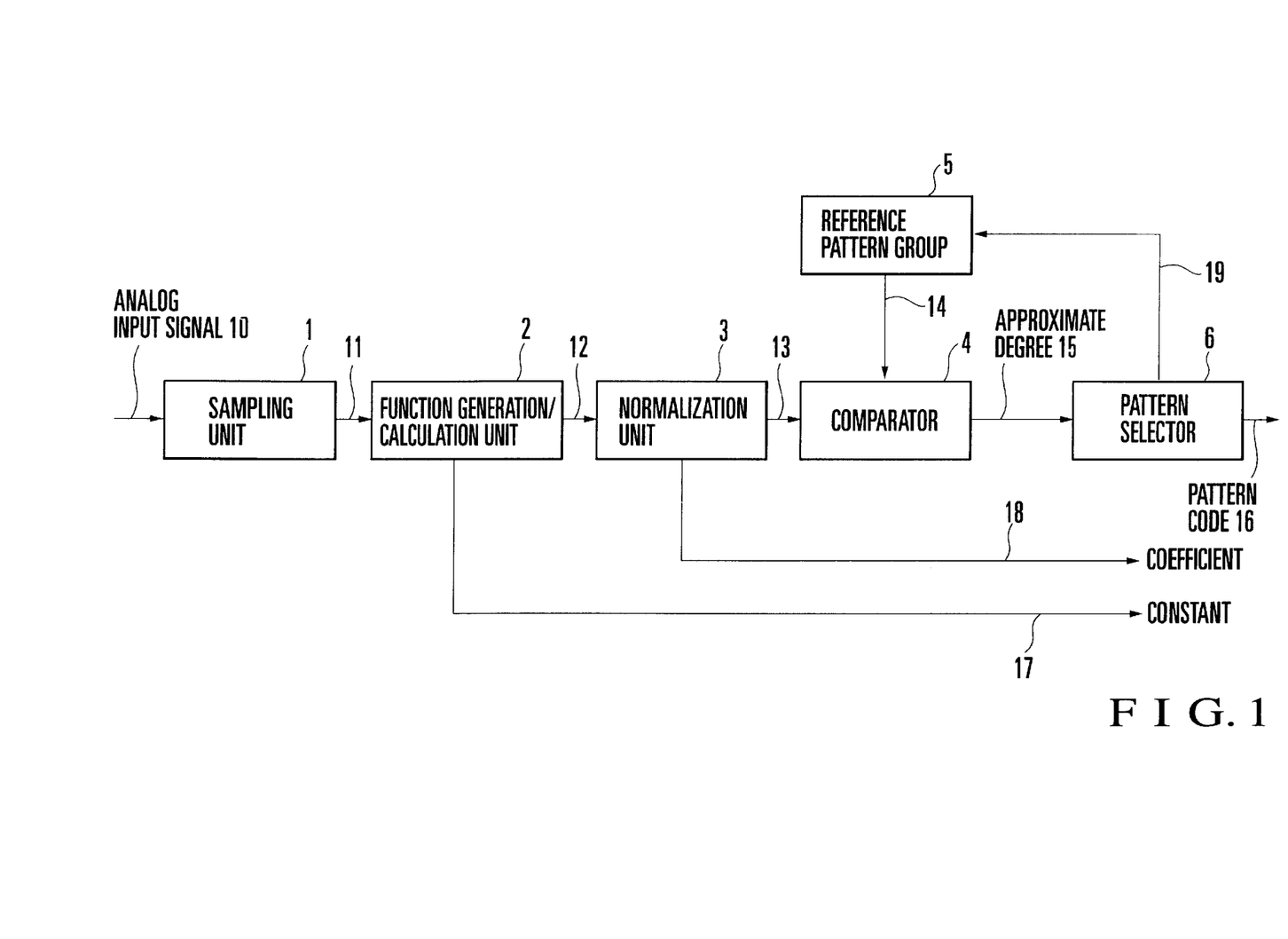
FIG. 1 is a block diagram showing a data compression apparatus according to the first embodiment of the present invention.

FIG. 1 shows a data compression apparatus according to the first embodiment of the present invention.

A sampling unit 1 is a means for sampling an analog input signal 10 to be compressed along the time axis (one-dimensionally). The analog input signal 10 is segmented into sampling strings, i.e., first patterns (first sampling strings) 11 every predetermined section, e.g., section having a length corresponding to six sample points.

At this time, the value (to be referred to as a sample value) of each sample point is not quantized and is still an analog value.

As an input, a sampled analog signal may be used.

A function generation/calculation unit 2 is constituted by a means (function generation unit) for generating a predetermined function for each section using a predetermined sample value included in a corresponding one of the first patterns 11 obtained by the sampling unit 1, and a means (calculation unit) for calculating the sample value of the generated function and the sample value of the first pattern.

Figure 2A:
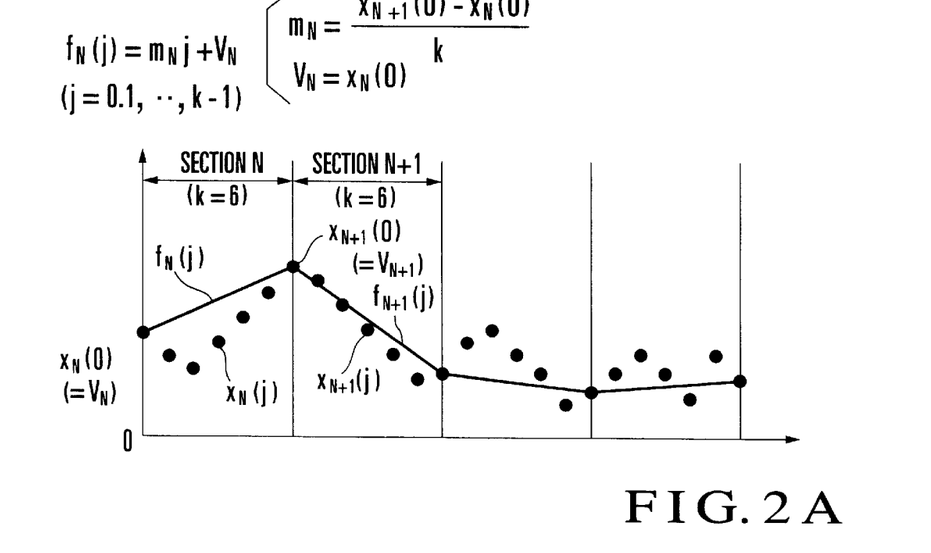
FIGS. 2A to 2C are graphs, respectively, showing data compression steps.
Figure 2B:
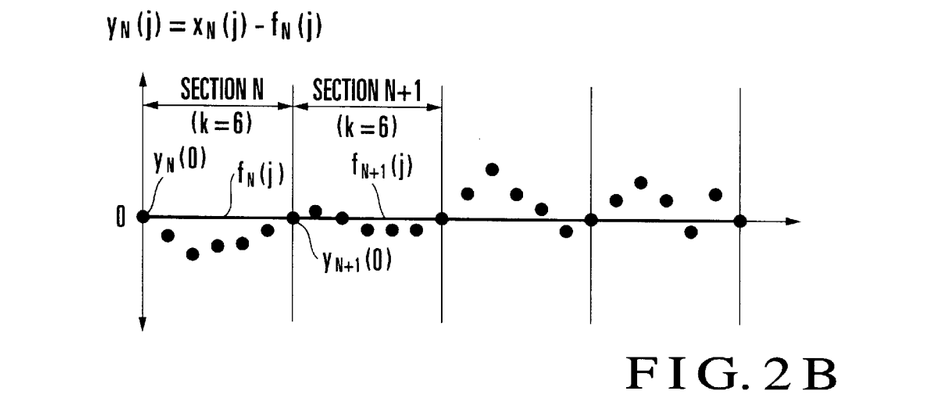
Figure 2C:
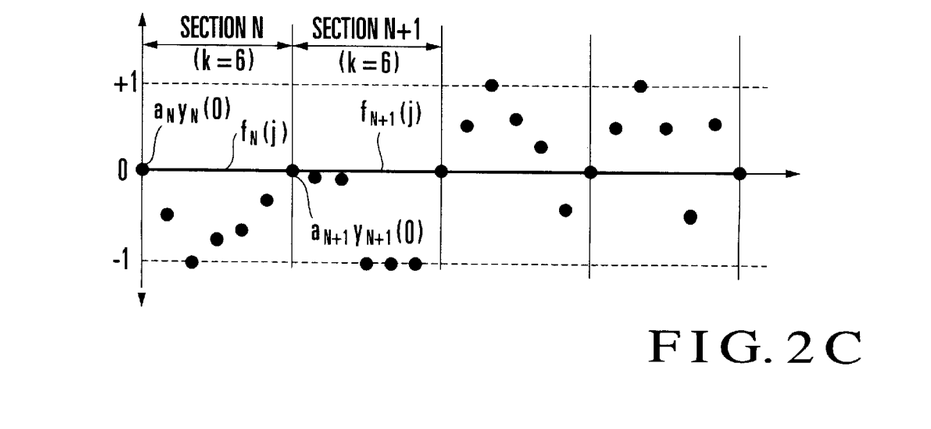

FIGS. 2A to 2C show data compression steps.

For example, let k be the number of sample points common to sections N, N+1, . . . ; and $x_N(j)$, each sample value in the section N.

Note that N and k are positive integers, and j is an integer satisfying $0 \leq j \leq k-1$.

Letting $V_N$ be the value of the start sample value $x_N(0)$ of the section N, and $V_{N+1}$ be the value of the start sample value $x_{N+1}(0)$ of the next section N+1, the first pattern 11 of the section N is approximated by function $f_N$ given by equation (1) or (2):

$$f_N(j) = x_N(0) = V_N \quad (1)$$

$$f_N(j) = m_N j + x_N(0) = m_N j + V_N \quad (2)$$

for $m_N = (x_N(0) - x_{N+1}(0))/k = (V_N - V_{N+1})/k$

A sampling string obtained by these functions is called the second pattern. The function generation/calculation unit 2 outputs parameters (including a coefficient and constant) used in these functions.

Equation (1) approximates the sampling string, i.e., first pattern 11 of each section by the start sample value of the section. $V_N$ (constant 17) is output as a parameter for each section (not shown).

As shown in FIG. 2A, equation (2) approximates the first pattern 11 of each section by a straight line, i.e., linear function which connects the start sample value of a section to the start sample value of the next section. $V_N$ (bias) and $m_N$ (gradient) are generated as parameters for defining the linear function for each section, and are output as elements constituting compressed data.

In equation (2), k is constant between respective sections, and $m_N$ is given by $V_N$ and $V_{N+1}$. As a parameter in each section, only $V_N$ (constant 17) is output for each section and stored till reconstruction of compressed data.

Since $V_{N+1}$ of the next section is also stored, $m_N$ need not be output or stored because it can be reconstructed by $V_N$ and $V_{N+1}$ at the reconstruction.

A normalization unit 3 is a means for calculating the values of corresponding sample points for the first pattern 11 and second pattern, and obtaining a new sampling string, i.e., third pattern 12.

As shown in FIG. 2B, the third pattern 12, i.e., $y_n(j)$ includes 0 as at least the value of one sample point in the pattern.

For example, in FIG. 2A, the second pattern is created such that the start sample values $f_N(0), f_{N+1}(0), \ldots$ of the second patterns coincide with corresponding sample values $x_N(0), x_{N+1}(0), \ldots$ of the first patterns 11. The differences between corresponding sample values are calculated by $$y_N(j)=x_N(j)-f_N(j) \quad (3)$$

In equation (3), $f_N(j)$ is a linear function, but a higher-order function or another function may be used. An appropriate function may be used in next pattern comparison so far as the function satisfies the conditions of the third pattern 12.

A comparator 4 is a means for comparing the third pattern 12 with a predetermined sampling string, i.e., reference pattern 14 selected from a reference pattern group 5 by a pattern selector 6 (to be described later), and outputting the correlation value between the patterns 12 and 14 as an approximate degree 15.

Since at least one sample value is 0 in the third pattern 12, the correlation with the reference pattern 14 is obtained for only the remaining sample values.

This reduces the number of samples to be compared. The comparison time, and an area (memory or the like) for storing many reference pattern groups can be reduced.

More specifically, assuming that each sample value may take i values on the reference pattern 14, the number of sample points is k, and the number of reference patterns 14 is $i^k$. However, since a predetermined one of the sample points is fixed to 0, the number of reference patterns 14 is $i^{k-1}$ This difference increases for larger i or k.

The pattern selector 6 is a means for sequentially selecting the reference patterns 14 from the reference pattern group 5 in accordance with a pattern selection signal 19, and encoding and outputting a reference pattern 14 exhibiting the highest correlation level with the third pattern 12 on the basis of the approximate degree 15 output from the comparator 4.

As a result, a pattern code 16 corresponding to the reference pattern 14 approximated to the third pattern 12 with the smallest error is output as an element of compressed data for each section.

In this manner, a function approximated using a sample value at a predetermined sample point included in the first pattern 11 is generated. The second pattern made up of sample values obtained at respective sample points by this function is created. New sample values are calculated from the first and second patterns to create the third pattern 12 in which a new sample value at at least an arbitrary sample point is 0. The third pattern 12 is compared with the reference patterns 14 to select the most approximate reference pattern 14. The pattern code 16 applied to the reference pattern 14 is output as compressed data of the first pattern 11 for each section.

Consequently, no rounding error at the least significant bit occurs in digital calculation, unlike the conventional data compression of operating digital data obtained by A/D-converting analog data. A decrease in sample value precision by the compression algorithm can be avoided.

No function approximation, orthogonal transform, and encoding need be performed by digital numerical calculations, and neither dedicated integrated circuits nor high-speed MPU for executing them are required. The product development cost, product cost, and power consumption can be reduced.

In the above description, the number of patterns to be compared can be reduced by selecting a function such that two sample values at two ends among the sample values of the third pattern 12 are 0.

That is, the number of patterns can decrease to $i^{k-2}$.

The second embodiment of the present invention will be explained.

In the second embodiment, each sample value of a third pattern 12 is normalized based on the maximum or minimum sample value, and the third pattern 12 is compared with a reference pattern 14.

For example, as shown in FIG. 2C, a normalization unit 3 calculates for each section a magnification $a_N$ which makes the maximum absolute value of the third pattern 12 be equal to the maximum absolute value (1 in this case) of the reference pattern 14. Then, the normalization unit 3 outputs the magnification $a_N$ as a coefficient 18.

The magnification $a_N$ is added to each sample value of the third pattern 12 to create a fourth pattern 13 having the same maximum amplitude as that of the reference pattern 14.

A comparator 4 compares the fourth pattern 13 with the reference pattern 14 to calculate a correlation value.

As a result, one of sample values, i.e., a sample value having the maximum absolute value is fixed to decrease the degree of freedom, compared to the case of using the third pattern 12. The total number of reference patterns 14 prepared in advance can be decreased.

Note that the compression ratio is determined by the number of sample values constituting each sampling string.

For example, when the sample value is quantized and stored by 8 bits, 48 (=8×6) bits are required for k=6.

To the contrary, when the fourth pattern 13 is used, and the constant $V_N$, a pattern code 16 of the reference pattern 14, and the normalization magnification $a_N$ are respectively represented by 8 bits, only 24 (=8×3) bits are required.

The compressed output data amount decreases to ½ for k=6, and ⅓ for k=9.

Similarly, when output data is stored in a memory, e.g., nonvolatile analog semiconductor memory capable of storing analog data as an analog value, the compressed output data amount decreases to ½ for k=6, and ⅓ for k=9.

The third embodiment of the present invention will be described with reference to FIG. 3.

In the third embodiment, the number of sample points in each section, i.e., the section length is set variable, and the maximum section length whose approximate degree with a reference pattern 14 is a predetermined value or less.

Compared to the second embodiment, one additional parameter is required to represent the section length. However, the section length of each section can increase on average to increase the compression ratio of original data.

As a method of determining the section length, for example, when the approximate degree with the reference pattern 14 is calculated in a comparator 4, sample points for the section of original data may be increased one by one to adopt the finally obtained conditions (pattern) within an allowable error range.

Alternatively, an arbitrary range, e.g., a range of 32 points at maximum may be determined to select the optimum length within this range.

Figure 3:
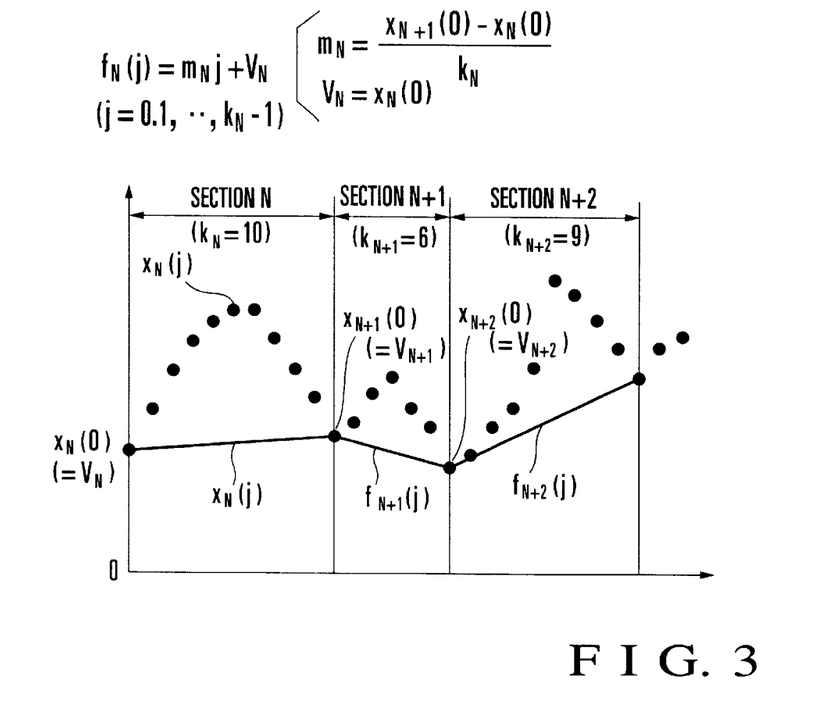
FIG. 3 is a graph showing another data compression step.

If the section is set such that all $y_N(j)$ in equation (3) are 0 or more in respective sections, as shown in FIG. 3, the number of comparison reference patterns 14 prepared in advance can be decreased.

The number k of points in the section changes for respective sections. Letting M be the total number of sections, and H be the total number of sample points of original data, the number of reference patterns 14 is 4M/H.

Note that the section length may be adjusted for each section in accordance with an external instruction input outside the data compression apparatus. Data can be compressed with a section length optimal for an analog input signal 10.

The fourth embodiment of the present invention will be described.

In the fourth embodiment, when data cannot be compressed within a desired distortion ratio range even using any reference pattern 14 prepared in advance, compression of the section is abandoned (no compression), and sampled original data is directly output and stored subsequent to a predetermined pattern code 16 (e.g., a voltage value of 0).

The fourth embodiment is applied in combination with the first to third embodiments.

If an uncompressed pattern code 16 appears in an arbitrary section in reconstructing compressed data, original data (sample value) subsequent to the pattern code 16 is directly reconstructed and output.

At the end of the uncompressed section, another pattern code 16 is used. For example, a pattern code 16 representing the start of the uncompressed section may be repeated twice.

This can avoid any excessively large compression distortion which easily occurs when a small number of reference patterns 14 are used.

In the first to fourth embodiments, the linear function is used as the second pattern, but a high-order function may be used.

When the high-order function is used, the approximate precision increases, but calculation is complicated.

As the high-order function, a prediction function may be used. As the prediction function, various interpolation functions such as spline and Lagrange functions can be used. The interpolation function may be changed in accordance with the property of target data.

Reconstruction of data compressed by each of the above-described embodiments will be explained as the fifth embodiment of the present invention with reference to FIG. 4.

Figure 4:
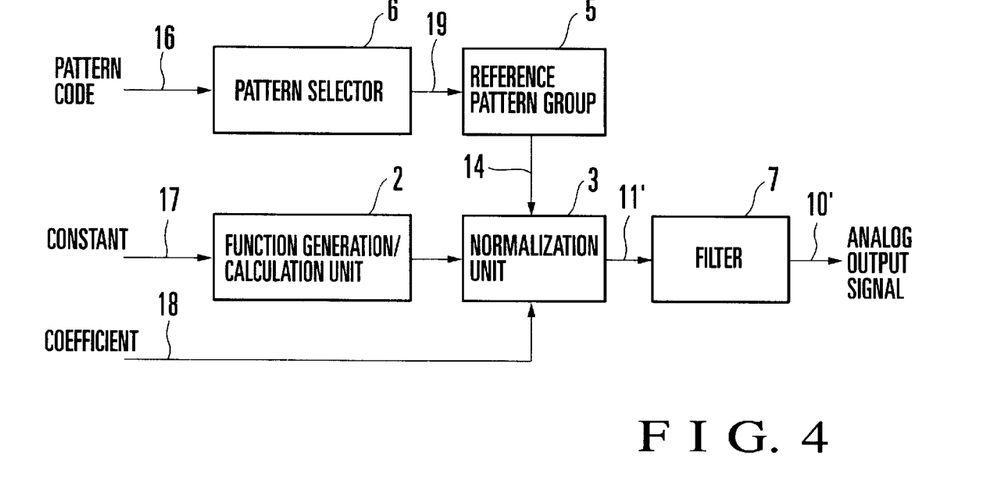
FIG. 4 is a block diagram showing a data reconstruction apparatus.

FIG. 4 shows a data reconstruction apparatus.

Compressed data is reconstructed by processing reverse to the above compression processing.

More specifically, as shown in FIG. 4, a pattern code 16 of compressed data is input to a pattern selector 6 to generate a pattern selection signal 19, and a reference pattern 14 corresponding to the pattern code 16 is read from a reference pattern group 5.

On the basis of a constant 17 of the compressed data, a function generation/calculation unit 2 generates an approximate function approximated to the sampling string of original data.

A normalization unit 3 performs calculation using a coefficient 18 of the compressed data, reference pattern 14, and approximate function, thereby reconstructing sample values constituting a sampling string 11' which approximates the first pattern obtained from the original data.

The sample values reconstructed for each section pass through a low-pass filter 7, as needed, thereby reconstructing a smooth analog signal 10' approximate to an analog input signal 10.

As for the reference pattern group 5, similar pattern codes 16 may be applied to reference patterns 14 which are not so different from each other.

Even if the pattern code 16 has an error in a read, and a slightly different reference pattern 14 is used for reconstruction, no excessive error occurs in a reconstructed sampling string, and the pattern code 16 can be stored as an analog value.

An application example of the present invention will be described with reference to FIG. 5.

Figure 5:
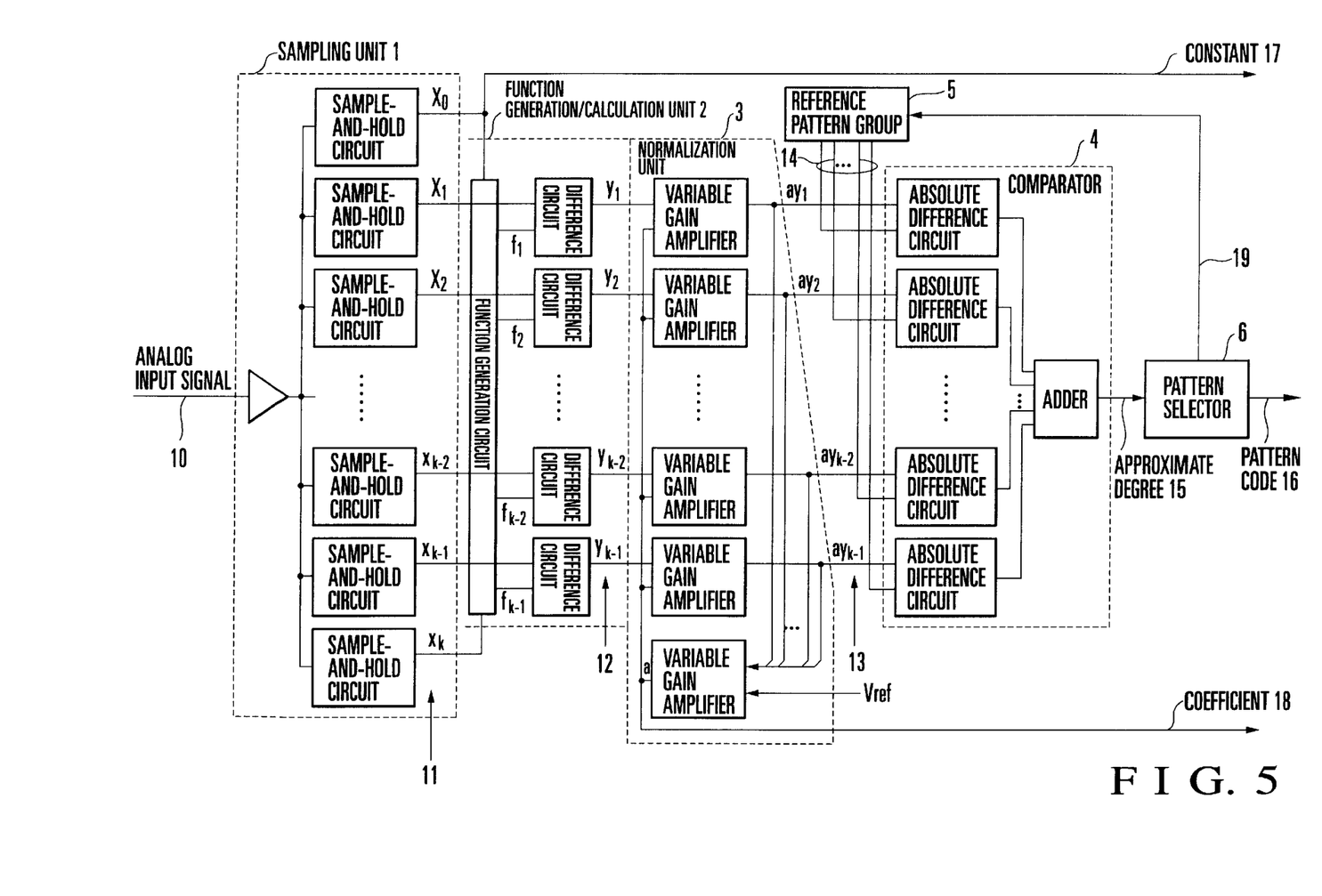
FIG. 5 is a block diagram showing a data compression apparatus according to an application example of the present invention.

FIG. 5 shows a data compression apparatus according to the application example of the present invention to which the third embodiment is applied.

This application example assumes that analog data is stored in a memory, e.g., nonvolatile analog semiconductor memory capable of storing an analog value. A constant 17 and coefficient 18 are output as analog values.

Figure 6:
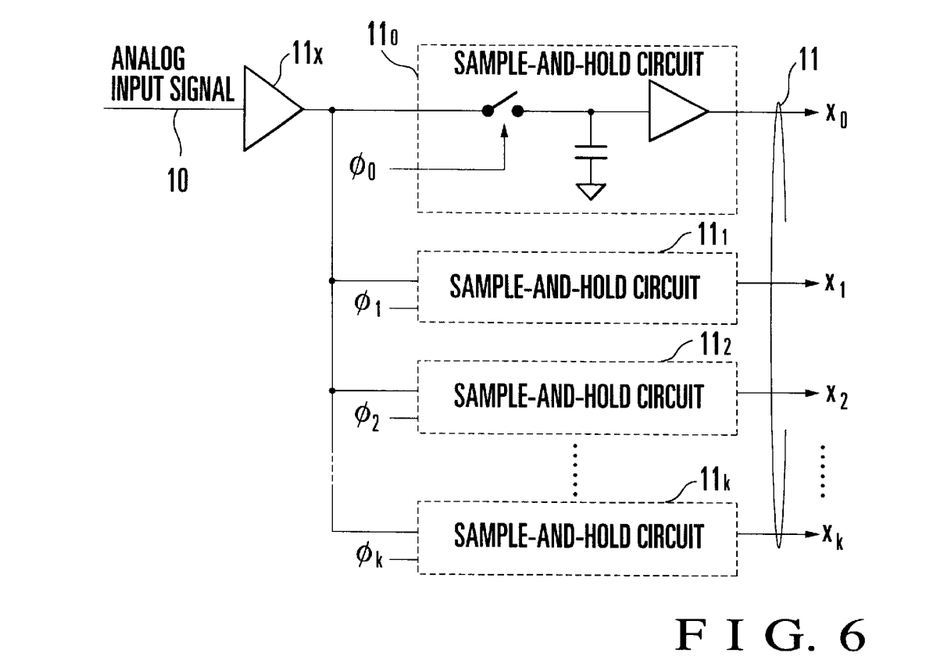
FIG. 6 is a block diagram showing an arrangement of a sampling unit.

As shown in FIG. 6, a sampling unit 1 comprises an amplifier 11$x$ on the input stage for amplifying an analog input signal 10 to a proper amplitude, and (k+1) sample-and-hold circuits $11_0$ to $11_k$ for sampling an output from the amplifier at timings $\phi 0$ to $\phi k$ corresponding to respective sample points.

The respective sample-and-hold circuits output parallel sample values $x_0$ to $x_k$ constituting a first pattern 11.

Figure 7:
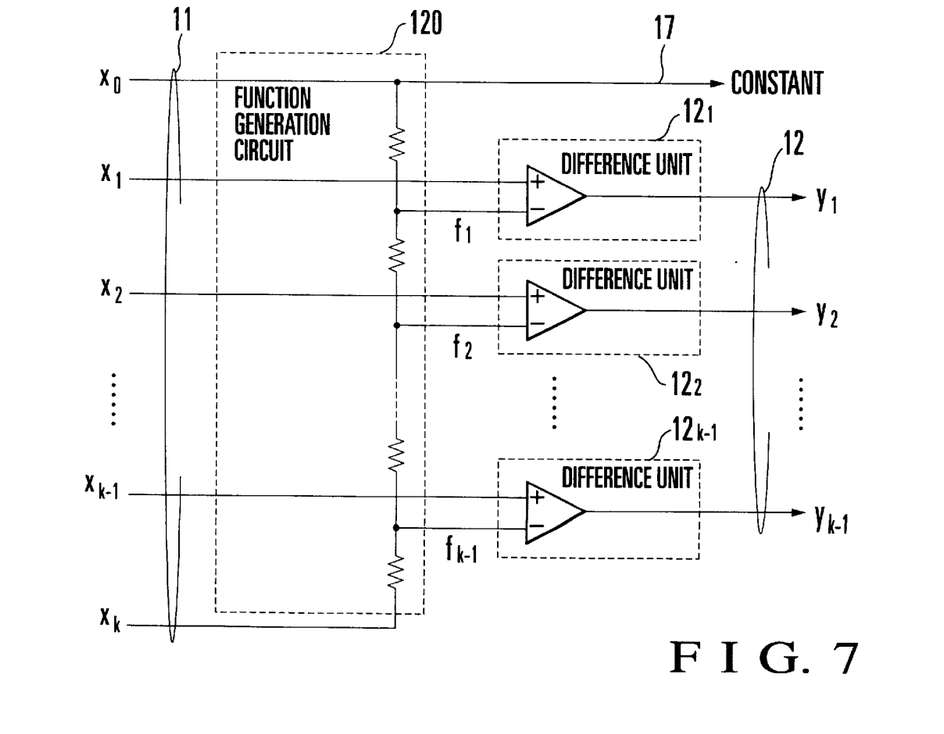
FIG. 7 is a block diagram showing an arrangement of a function generation/calculation unit.

As shown in FIG. 7, a function generation/calculation unit 2 comprises a function generation circuit $12_O$ (function generation unit) for generating an approximate function from the start sample value $x_0$ of a section and the start sample value $x_k$ of the next section, and (k−1) difference circuits $12_1$ to $12_{k-1}$ (calculation units) arranged parallel in correspondence with $x_1$ to $x_{k-1}$ of the first pattern 11.

In this case, the pattern is approximated by a linear function. In the function generation circuit $12_0$, the start sample value $x_0$ (voltage value $V_N$) of a section and the start sample value $x_k$ (voltage value $V_{N+1}$) of the next section are connected by a ladder resistance, and their difference voltage is divided by (k−1).

Then, sample values $f_1$ to $f_{k-1}$, i.e., second pattern values calculated by the linear function are generated.

The respective sample values of the second pattern output from the function generation circuit $12_0$ are individually compared with the sample values of the first pattern 11 by the difference circuits $12_1$ to $12_{k-1}$ to output differences $y_1$ to $y_{k-1}$ as a third pattern 12.

Figure 8:
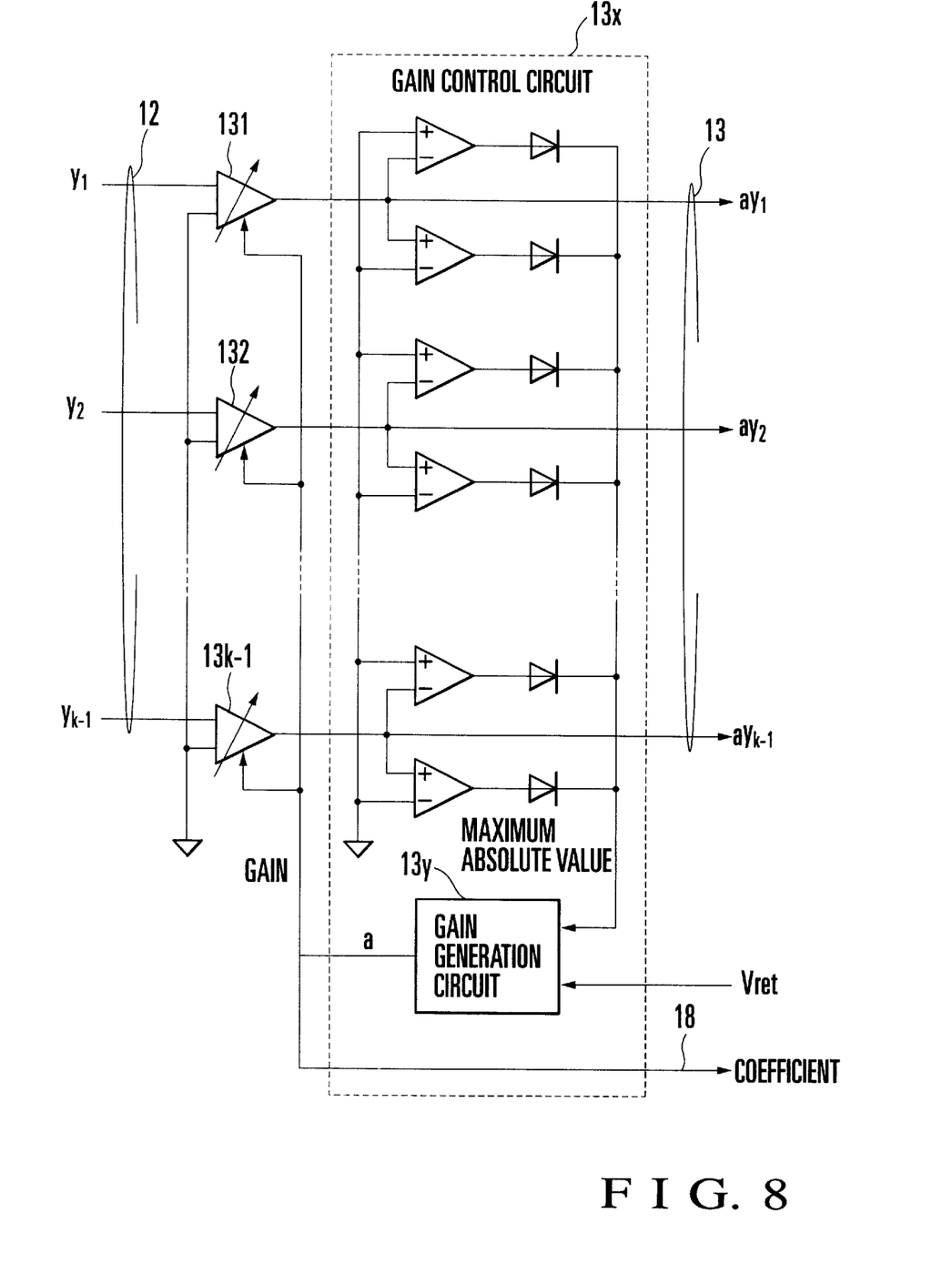
FIG. 8 is a block diagram showing an arrangement of a normalization unit.

As shown in FIG. 8, a normalization unit 3 comprises (k−1) variable gain amplifiers $13_1$ to $13_{k-1}$ arranged in correspondence with the respective sample values of a third pattern 12, and a gain control circuit 13$x$ for controlling a gain a of the variable gain amplifiers $13_1$ to $13_{k-1}$ to normalize outputs $ay_1$ to $ay_{k-1}$ from the variable gain amplifiers $13_1$ to $13_{k-1}$, i.e., a fourth pattern 13 with respect to a reference pattern 14.

The gain control circuit 13$x$ detects an absolute value having the maximum value, i.e., maximum absolute value in the fourth pattern 13 by many comparators and diodes.

A gain generation circuit 13$y$ generates the gain a of each variable gain amplifier for normalizing the fourth pattern 13 using the maximum absolute value of the fourth pattern 13 and a maximum absolute value Vref of the reference pattern 14.

Figure 9:
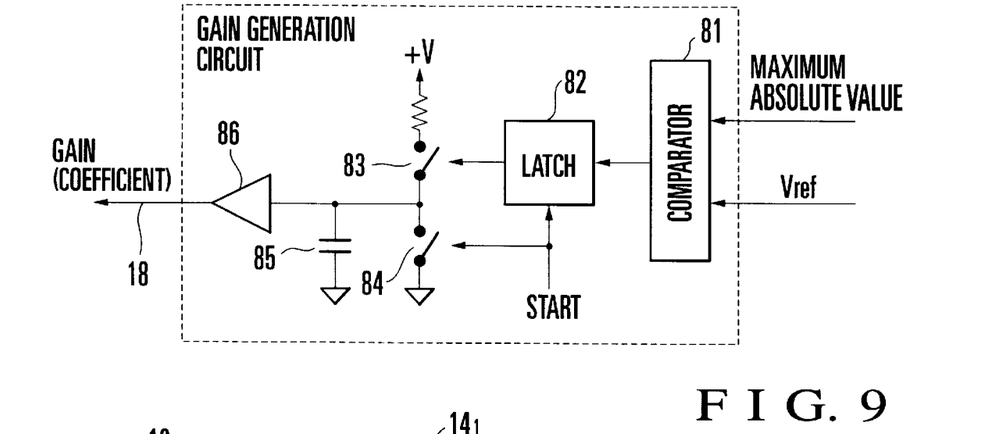
FIG. 9 is a block diagram showing a gain generation circuit.

FIG. 9 shows an example of the arrangement of the gain generation circuit.

In this case, a switch 84 is temporarily turned on by a start signal representing the start of gain control operation, a capacitive element 85 discharges, and the coefficient 18 output from a buffer 86, i.e., the gain a of the variable gain amplifiers $13_1$ to $13_{k-1}$ is changed to 0.

Then, the switch 84 is turned off, a switch 83 is turned on by an output from a latch 82, the capacitive element 85 is gradually charged by a voltage +V, and a voltage, i.e., gain a output from the buffer 86 gradually increases.

Along with this, the amplitude of the fourth pattern 13 increases and the maximum absolute value increases as well. Then an output from a comparator 81 is inverted when the maximum absolute value substantially reaches Vref.

An output from the latch 82 is inverted to turn off the switch 83. At this time, the gain a is held and output from the buffer 86, and the fourth pattern 13 normalized to the reference pattern is output from the variable gain amplifiers $13_1$ to $13_{k-1}$.

The gain a is output as the coefficient 18 which is stored as an element of compressed data together with the constant 17 and pattern code 16 (to be described later).

Figure 10:
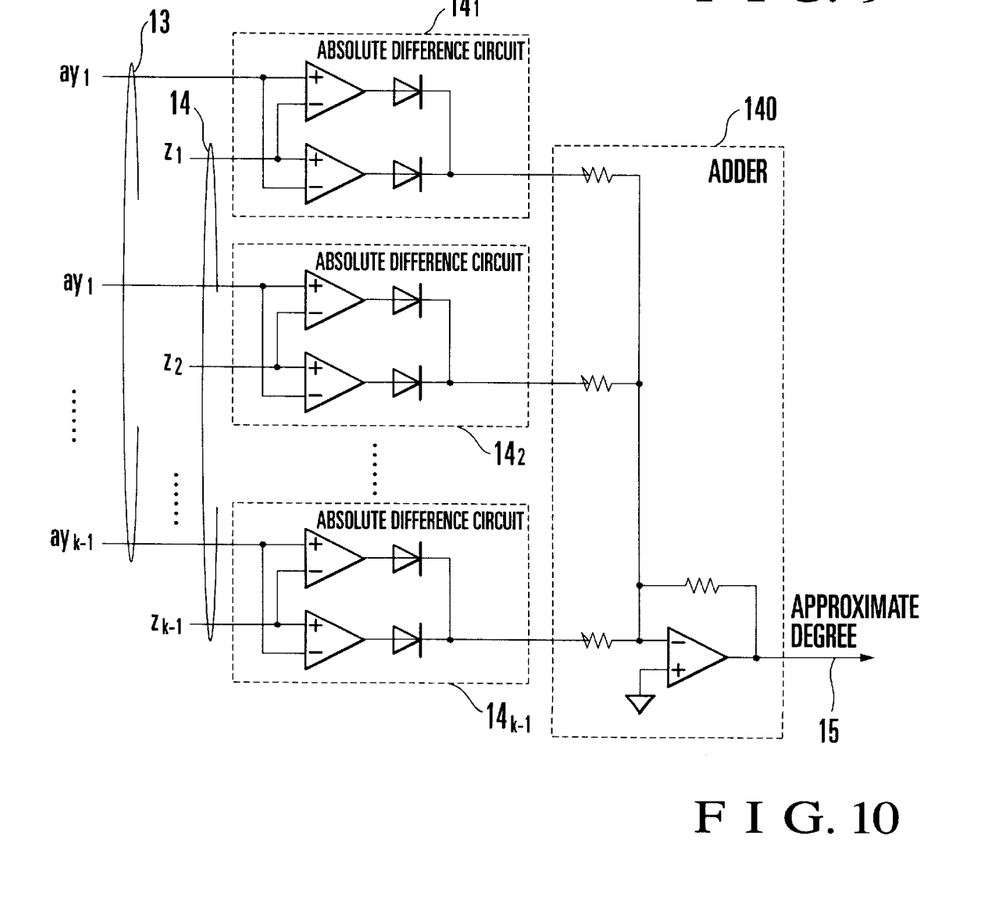
FIG. 10 is a block diagram showing an arrangement of a comparator.

As shown in FIG. 10, a comparator 4 comprises absolute difference circuits $14_1$ to $14_{k-1}$ for outputting for respective sample values the absolute difference values between the fourth pattern 13, i.e., $ay_1$ to $ay_{k-1}$ from the normalization unit 3 and the reference pattern 14, i.e., $z_1$ to $z_{k-1}$, and an adder $14_0$ for adding outputs from these absolute difference circuits and outputting the correlation value between the fourth and reference patterns 13 and 14 as their approximate degree 15.

As the difference between the sample values of the fourth and reference patterns 13 and 14 is smaller, a smaller approximate degree 15 is output.

Figure 11:
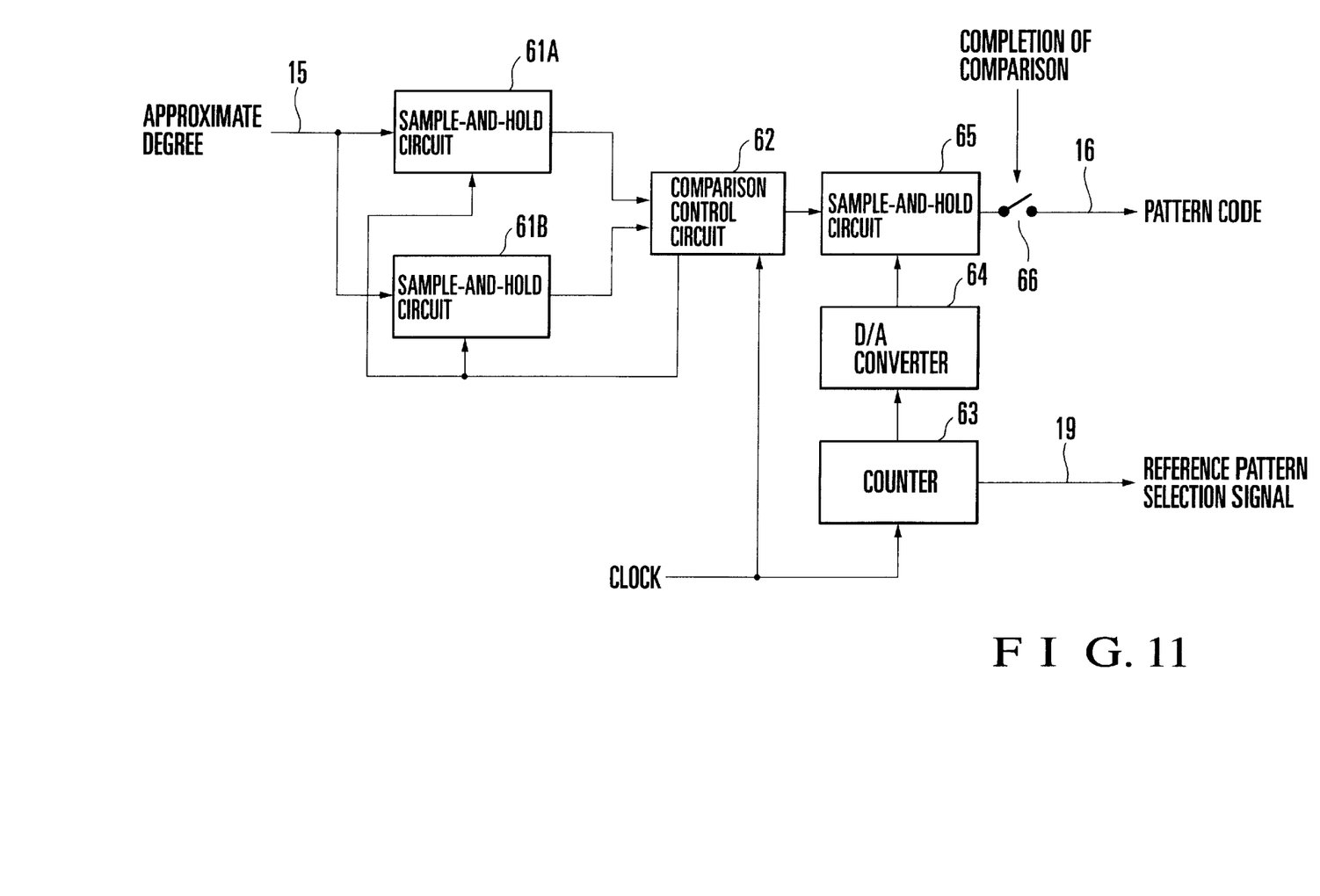
FIG. 11 is a block diagram showing an arrangement of a pattern selector.

As shown in FIG. 11, a pattern selector 6 comprises a counter 63 for counting predetermined clocks. A count output is output to a reference pattern group 5 as a reference pattern selection signal 19, and reference patterns 14 are sequentially switched and output to the comparator 4.

A comparison control circuit 62 controls sample-and-hold circuits 61A and 61B to hold in either circuit the approximate degree 15 between the fourth pattern 13 and the reference pattern 14 selected by the reference pattern selection signal 19.

The approximate degree is compared with a comparison reference approximate degree held in the other circuit, i.e., the smallest approximate degree obtained previously. If an approximate degree smaller than the held approximate degree is found, the smaller approximate degree is held as a subsequent comparison reference. At the same time, a pattern code representing the selected reference pattern is held by a sample-and-hold circuit 65.

After an output from the counter 63 is converted into analog data by a D/A converter 64, the data is held by the sample-and-hold circuit 65.

In this way, the approximate degrees 15 between the fourth pattern 13 and the respective reference patterns 14 of the reference pattern group 5 are sequentially compared. Upon the completion of comparison, a switch 66 is turned on. The sample-and-hold circuit 65 outputs a pattern code 16 representing a reference pattern 14 corresponding to the smallest approximate degree 15, i.e., a reference pattern 14 most approximate to the fourth pattern 13.

The completion of comparison may be determined after all the reference patterns are compared. Alternatively, the completion of comparison may be determined when an approximate degree 15 equal to or smaller than a predetermined threshold is found.

This can shorten the data compression time while suppressing errors between original data and compressed data to a certain degree.

In this application example, sample values made up of k sampled analog data in each section are output as three analog data, i.e., the pattern code 16, constant 17, and coefficient 18.

Accordingly, when compressed data is to be stored in a memory capable of storing an analog value (or multilevel digital data), the data is compressed to 3/k.

The application example has exemplified one-dimensional data such as audio data sampled on the time axis. However, the data compression apparatus of the present invention is not limited to audio data, but can also process two-dimensional data such as an image, e.g., an output from an image sensor as one-dimensional data.

The conventional method must process analog data as two-dimensional data. To convert analog data into two-dimensional data, data of several lines must be held and processed as analog data. This is very difficult to perform without deteriorating data.

Image data compression processing according to the present invention can compress data every horizontal line without referring to data of adjacent lines, unlike the conventional digital method of compressing an image by segmenting it into small blocks.

That is, one line is divided into a plurality of fixed-length sections without using any correlation between lines. The pattern of each section is compressed by replacing the pattern by the most approximate reference pattern and parameter for adjusting it.

When the present invention is applied to image data compression processing, the following effects can be attained.

1. Image data can be compressed/reconstructed regardless of an aspect ratio.

In other words, the number of sample points of transmitted data is only an integer multiple of divided sections, and is not limited to the number of two-dimensional sample points, unlike digital orthogonal transform compression.

2. Audio data and image data can share a compression/reconstruction circuit.

Input data is basically one-dimensionally processed, so that the present invention can be applied to various fields such as fields of audio and image data processing.

3. The number of reference patterns can be decreased, and a plurality of reference pattern groups can be easily prepared.

For example, in case 2, reference patterns can be switched and used, as needed.

4. A phenomenon that the distortion ratio increases at the section boundary, e.g., block distortion in a conventional compressed image does not occur.

Especially for the horizontal line direction subjected to compression, an approximate function f is determined to set 0 at the two ends of a section. No error occurs at the section boundary in principle, and distortion can be reduced.

As for the vertical direction, distortion occurs at random positions and does not stand out at a specific position, unlike block distortion.

As has been described above, according to the present invention, an analog input signal is compressed by decomposing the first sampling string obtained by sampling the analog input signal for each section, into elements such as a parameter defining the approximate function of the first sampling string and a pattern code representing a reference pattern for correcting the difference between the approximate function and first sampling string.

Hence, data can be compressed without converting an analog input signal into digital data. A circuit capable of performing high-speed compression with low power consumption can be easily constructed. A portable electronic camera, audio recording apparatus, and data recording apparatus having large data storage capacities can be manufactured.

All processes can be done for analog data using an analog circuit without digitizing (quantizing) the data. This realizes high-speed processing and low power consumption.

In analog data compression/reconstruction, neither A/D nor D/A converters are required on a signal path in principle, and no numeral calculation is required for quantized digital data. Compared to digital compression/reconstruction, the power consumption can be reduced, and the processing speed can be increased.

What is claimed is:

1. A data compression method of sequentially sampling an analog input signal at discrete sample points, classifying a plurality of obtained sample values into a plurality of sections, and compressing the analog input signal, comprising the steps of:

setting a sampling string made up of sample values included in each section as a first sampling string of the section;

generating a function which takes a sample value at a predetermined sample point included in the first sampling string and is approximated to the first sampling string, outputting a parameter defining the function as an element of compressed data of the section, and generating a second sampling string made up of sample values obtained at respective sample points by the function;

performing predetermined calculation between two sample values at identical sample points in the first and second sampling strings for each section to calculate a new sample value, thereby creating for each section a third sampling string in which a new sample value at an arbitrary sample point is 0; and comparing for each section the third sampling string with a plurality of reference patterns set as reference sampling strings in advance, selecting a reference pattern most approximate to the third sampling string, and outputting a pattern code representing the selected reference pattern as an element of compressed data of the section.

2. A method according to claim 1, further comprising generating a function which takes sample values at a plurality of sample points included in the first sampling string and is approximated to the first sampling string, thereby creating a third sampling string in which sample values at, at least two arbitrary sample points are 0.

3. A method according to claim 1, further comprising generating a linear function which takes a first sample value at a start sample point of the first sampling string in a section and has a fixed gradient, and outputting the first sample value serving as a constant defining the function, as an element of compressed data of the section.

4. A method according to claim 1, further comprising generating a linear function which takes a first sample value at a start sample point of a first sampling string in a section and has a gradient for connecting the first sample point to a second sample point at a start sample point of a first sampling string in a next section, and outputting the first sample value serving as a constant defining the function, as an element of compressed data of the section.

5. A method according to claim 1, further comprising creating a fourth sampling string normalized to the reference pattern by adjusting an amplification factor with respect to each sample value of the third sampling string for each section, outputting a coefficient representing the amplification factor as an element of compressed data of the section, and comparing the fourth sampling pattern with reference patterns instead of the third sampling pattern, thereby selecting a reference pattern most approximate to the third sampling string.

6. A method according to claim 1, wherein each section individually has a section length made up of an arbitrary number of sample points.

7. A method according to claim 6, wherein the section length of each section is a maximum section length which makes an error between the third sampling string and reference pattern in each section be not more than a predetermined allowable value.

8. A method according to claim 6, further comprising preparing a plurality of reference patterns corresponding to a plurality of section lengths, and switching and selecting the reference patterns in accordance with the section length of each section.

9. A method according to claim 6, further comprising determining the section length of each section by an external instruction signal.

10. A method according to claim 1, further comprising, when errors between the third sampling strings and all reference patterns are larger than a predetermined allowable range, directly outputting each sample value of the first sampling string.

11. A method according to claim 1, further comprising preparing a nonvolatile semiconductor memory capable of storing an analog value and storing data obtained by compression as the analog value in said nonvolatile semiconductor memory.

12. A data compression apparatus for sequentially sampling an analog input signal at discrete sample points, classifying a plurality of obtained sample values into a plurality of sections, and compressing the analog input signal, comprising:

a function generation unit for setting a sampling string made up of sample values included in each section as a first sampling string of the section, generating a function which is approximated to the first sampling string using a sample value at a predetermined sample point included in the first sampling string, outputting a parameter defining the function as an element of compressed data of the section, and generating a second sampling string made up of sample values obtained at respective sample points by the function;

a calculation unit for performing predetermined calculation between two sample values at the same sample point in the first and second sampling strings for each section to calculate a new sample value, thereby creating for each section a third sampling string in which a new sample value at an arbitrary sample point is 0;

a comparator for comparing for each section the third sampling string with a plurality of reference patterns set as reference sampling strings in advance; and a pattern selector for selecting a reference pattern most approximate to the third sampling string in accordance with comparison results of said comparator, and outputting a pattern code representing the selected reference pattern as an element of compressed data of the section.

13. An apparatus according to claim 12, further comprising a normalization unit arranged between said calculation unit and said comparator to create a fourth sampling string normalized to the reference pattern by adjusting an amplification factor with respect to each sample value of the third sampling string for each section, output a coefficient representing the amplification factor as an element of compressed data of the section, and output the fourth sampling pattern instead of the third sampling pattern to said comparator.

* * * * *